(12) United States Patent
Ishii et al.

(10) Patent No.: US 9,165,870 B2
(45) Date of Patent: *Oct. 20, 2015

(54) SEMICONDUCTOR STORAGE DEVICE AND MANUFACTURING METHOD THEREOF

(75) Inventors: Hitoshi Ishii, Kanagawa (JP); Naohisa Okumura, Kanagawa (JP); Taku Nishiyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 385 days.

This patent is subject to a terminal disclaimer.

(21) Appl. No.: 13/168,292

(22) Filed: Jun. 24, 2011

(65) Prior Publication Data

US 2011/0316134 A1    Dec. 29, 2011

(30) Foreign Application Priority Data

Jun. 29, 2010  (JP) ................................ 2010-147869

(51) Int. Cl.
*H01L 23/02* (2006.01)
*H01L 23/48* (2006.01)
(Continued)

(52) U.S. Cl.
CPC ...... *H01L 23/49575* (2013.01); *H01L 23/3107* (2013.01); *H01L 23/49855* (2013.01); *H01L 25/18* (2013.01); *H01L 23/49861* (2013.01); *H01L 23/50* (2013.01); *H01L 24/45* (2013.01); *H01L 24/48* (2013.01); *H01L 24/49* (2013.01); *H01L 25/0652* (2013.01); *H01L 25/0657* (2013.01); *H01L 2224/45144* (2013.01); *H01L 2224/48091* (2013.01); *H01L 2224/48145* (2013.01); *H01L 2224/48227* (2013.01); *H01L 2224/49171* (2013.01);
(Continued)

(58) Field of Classification Search
CPC .................. H01L 23/49582; H01L 23/49551; H01L 23/3121; H01L 23/49513; H01L 23/49558; H01L 23/49555; H01L 23/495; H01L 23/293

USPC .................................. 257/676, 679, 692, 693
See application file for complete search history.

(56) References Cited

U.S. PATENT DOCUMENTS 7,193,305 B1    3/2007  Miks et al.
8,314,478 B2   11/2012  Ishii et al.
(Continued)

FOREIGN PATENT DOCUMENTS

CN       102201414 A     9/2011
JP       2004-349396    12/2004

OTHER PUBLICATIONS

Combined Chinese Office Action and Search Report issued Jun. 3, 2013 in Patent Application No. 201110178148.0 with English Translation.

(Continued)

*Primary Examiner* — Ori Nadav
(74) *Attorney, Agent, or Firm* — Oblon, McClelland, Maier & Neustadt, L.L.P.

(57) ABSTRACT

According to the embodiment, a semiconductor storage device includes an organic substrate, a semiconductor memory chip, a lead frame, and a resin mold section. The lead frame includes an adhering portion. The organic substrate is singulated to have a shape in which a portion in which the organic substrate does not overlap with the placing portion is larger than a portion in which the organic substrate overlaps with the placing portion, in plan view. The lead frame further includes a first extending portion in the adhering portion that extends to a surface different from a surface of the resin mold section on a side of an insertion direction.

8 Claims, 11 Drawing Sheets

(51) Int. Cl.
*H01L 23/495* (2006.01)
*H01L 23/31* (2006.01)
*H01L 23/498* (2006.01)
*H01L 25/18* (2006.01)
*H01L 23/50* (2006.01)
*H01L 25/065* (2006.01)
*H01L 23/00* (2006.01)

(52) U.S. Cl.
CPC ............... *H01L 2224/49175* (2013.01); *H01L 2225/0651* (2013.01); *H01L 2225/06506* (2013.01); *H01L 2225/06562* (2013.01); *H01L 2924/01079* (2013.01); *H01L 2924/12044* (2013.01); *H01L 2924/1815* (2013.01); *H01L 2924/19105* (2013.01)

(56) References Cited

U.S. PATENT DOCUMENTS

2004/0169285 A1* 9/2004 Verma et al. .................. 257/777
2011/0233741 A1   9/2011 Ishii et al.

OTHER PUBLICATIONS

U.S. Appl. No. 13/408,392, filed Feb. 29, 2012, Doi, et al.
U.S. Appl. No. 13/027,668, filed Feb. 15, 2011, Ryoji Matsushima.
U.S. Appl. No. 13/051,582, filed Mar. 18, 2011, Hitoshi Ishii, et al.
Office Action issued Feb. 18, 2014, in Chinese Application No. 201110178148.0 (with English-language translation).
Chinese Office Action issued Aug. 21, 2014, in China Patent Application No. 201110178148.0 (with English translation).
Chinese Office Action dated Dec. 3, 2014, issued in Chinese Patent Application No. 201110178148.0 (with English translation).

* cited by examiner

SEMICONDUCTOR STORAGE DEVICE AND MANUFACTURING METHOD THEREOF

CROSS-REFERENCE TO RELATED APPLICATIONS

This application is based upon and claims the benefit of priority from the prior Japanese Patent Application No. 2010-147869, filed on Jun. 29, 2010; the entire contents of which are incorporated herein by reference.

FIELD

Embodiments described herein relate generally to a semiconductor storage device and a manufacturing method thereof.

BACKGROUND

Recently, semiconductor storage devices using a storage element such as a NAND-type flash memory are often used as a storage device of an external apparatus such as a mobile phone and a personal computer. Examples of a semiconductor storage device used in electronics include a memory card (semiconductor memory card).

In the semiconductor storage device, a semiconductor chip such as a semiconductor memory chip and a controller chip is mounted on a wiring substrate (organic substrate) on which external terminals are formed. An electrode of a semiconductor chip is electrically connected to a connection pad of the wiring substrate by applying wire bonding and is further sealed with resin to cover the whole semiconductor chip.

In such a conventional technology, it is desired to suppress the manufacturing cost by suppressing usage of the organic substrate.

DETAILED DESCRIPTION

In general, according to one embodiment, a semiconductor storage device includes an organic substrate in which an external connection terminal is provided on one surface and a semiconductor memory chip, and is insertable into an external apparatus. The semiconductor storage device further includes a lead frame that include a placing portion on which the semiconductor memory chip is placed and an adhering portion that is formed to extend toward a side of an insertion direction, which is from the placing portion to the external apparatus, and is adhered to another surface of the organic substrate, and a resin mold unit that exposes the external connection terminal, seals the organic substrate, the lead frame, and the semiconductor memory chip, and has an approximately rectangular shape in plan view. The organic substrate is singulated to have a shape in which the organic substrate substantially does not overlap with the placing portion in plan view in a state of being adhered to the adhering portion. The end portion of the adhering portion in the insertion direction is formed within the resin mold unit. The lead frame further includes a first extending portion in the adhering portion that extends to a surface different from a surface of the resin mold unit on the side of the insertion direction.

Exemplary embodiments of a semiconductor storage device and a manufacturing method thereof will be explained below in detail with reference to the accompanying drawings. The present invention is not limited to the following embodiments.

Figure 1:
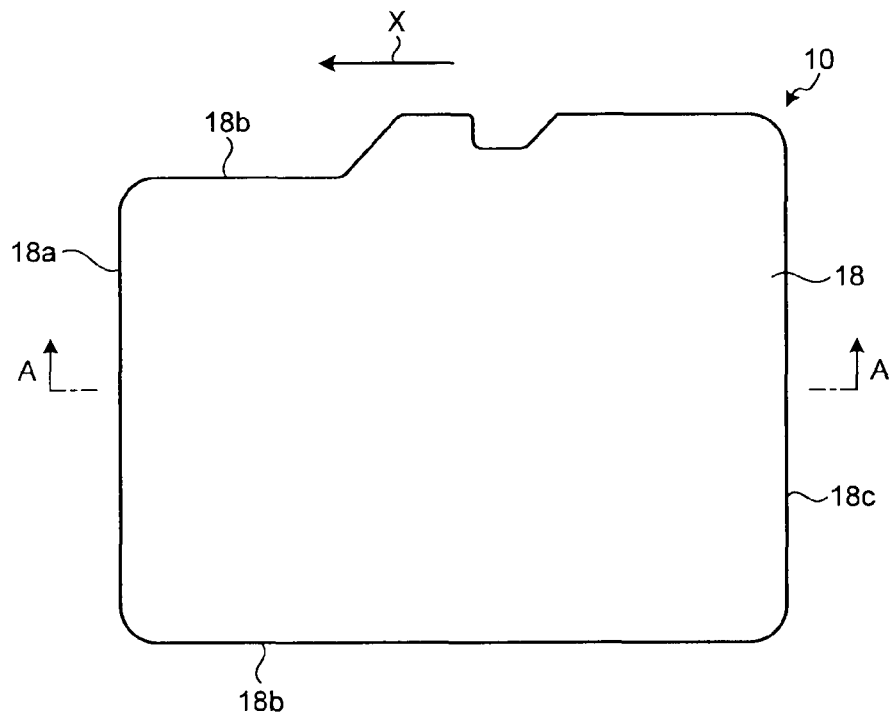
FIG. 1 is a plan view illustrating an outline of a semiconductor storage device according to an embodiment.
Figure 2:
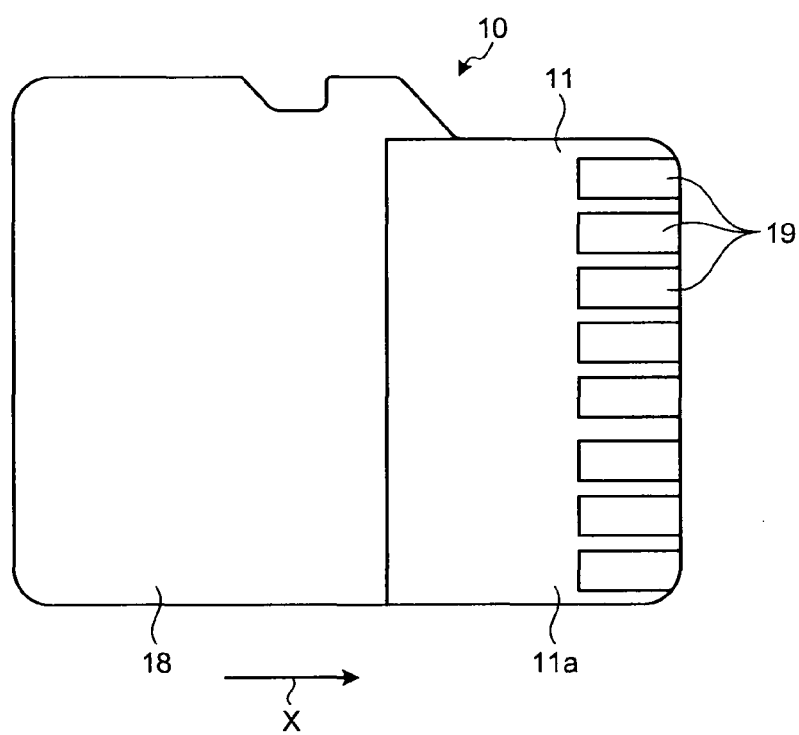
FIG. 2 is a bottom view illustrating the outline of the semiconductor storage device shown in FIG. 1.
Figure 3:
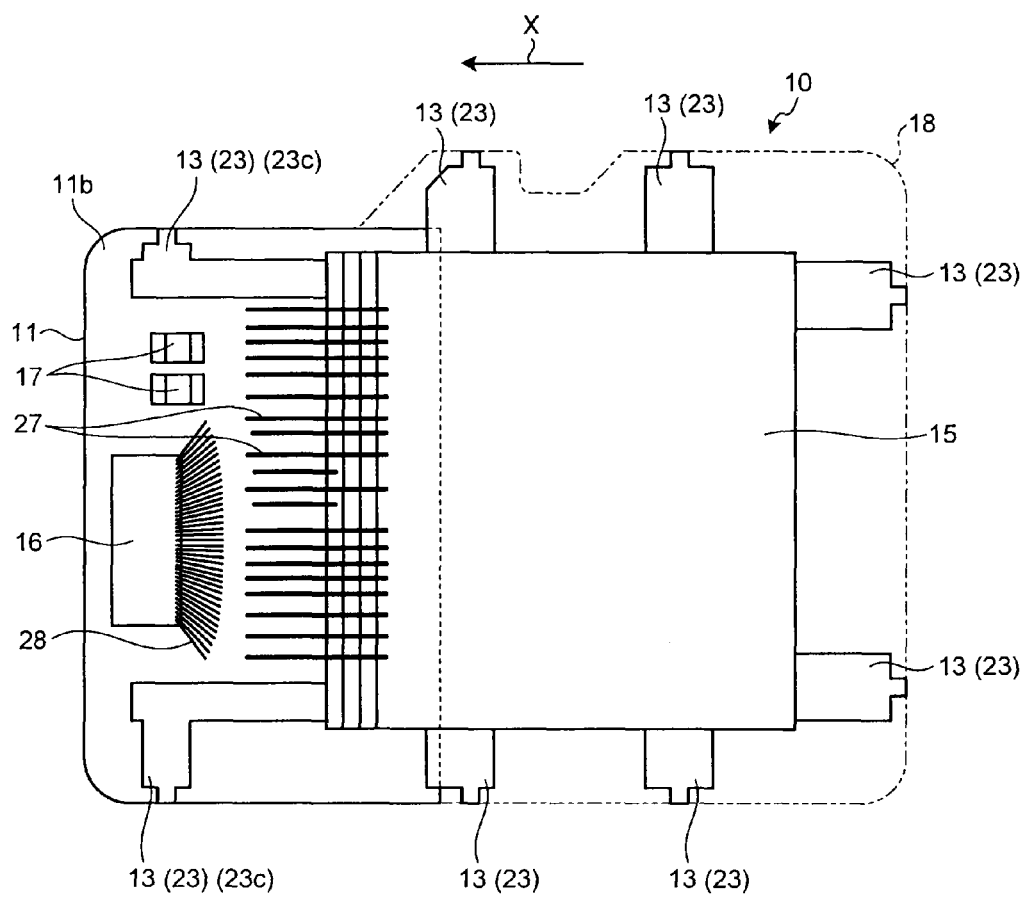
FIG. 3 is a diagram schematically illustrating the internal configuration of the semiconductor storage device shown in FIG. 1.
Figure 4:
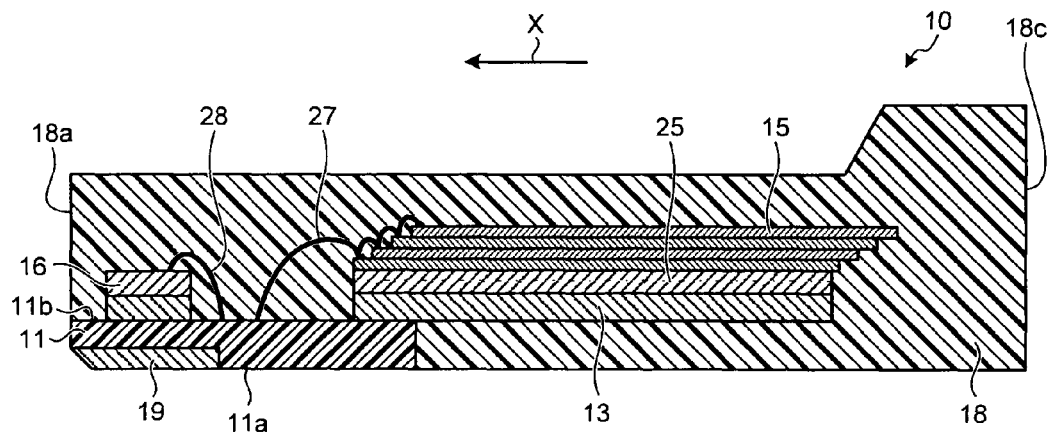
FIG. 4 is a transverse cross-sectional view illustrating a cross sectional structure along line A-A of the semiconductor storage device shown in FIG. 1.

FIG. 1 is a plan view illustrating an outline of a semiconductor storage device according to a first embodiment. FIG. 2 is a bottom view illustrating the outline of the semiconductor storage device shown in FIG. 1. FIG. 3 is a diagram schematically illustrating the internal configuration of the semiconductor storage device shown in FIG. 1. FIG. 4 is a transverse cross-sectional view illustrating a cross sectional structure along line A-A of the semiconductor storage device shown in FIG. 1. A semiconductor storage device 10 is used in a state of being inserted into a socket provided in an external apparatus such as a personal computer or a digital camera. The semiconductor storage device 10 functions as an external storage device. The insertion direction of the semiconductor storage device 10 is a direction indicated by an arrow X.

The semiconductor storage device 10 includes an organic substrate 11, a lead frame 13, a semiconductor memory chip 15, a controller chip 16, electronic components 17, and a resin mold section 18. In the semiconductor storage device 10, as shown in FIGS. 1 and 2, the outer periphery is covered by the resin mold section 18 in a state where external connection terminals 19 are exposed on the bottom surface side. The semiconductor storage device 10 is covered by the resin mold section 18 to have an approximately rectangular shape in plan view.

The organic substrate 11 is, for example, formed by providing a wiring inside or on a surface of an insulating resin substrate, and functions both as an element mounting substrate and as a terminal forming substrate. As such organic substrate 11, a printed-wiring board using glass-epoxy resin, BT resin (bismaleimide-triazine resin), or the like is used. Although not shown in detail in the drawings, the organic substrate 11 has a multilayered structure and the material to be used is different in each layer in some cases.

Figure 5:
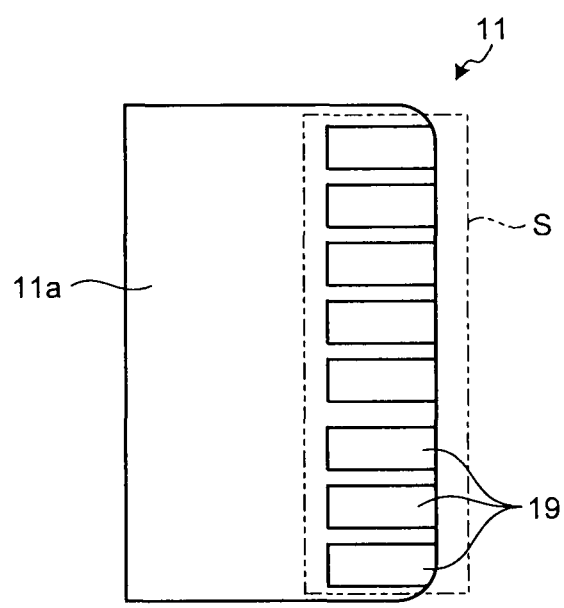
FIG. 5 is a bottom view of an organic substrate.

FIG. 5 is a bottom view of the organic substrate 11. On a bottom surface (one surface) 11a of the organic substrate 11, the external connection terminals 19 including a metal layer are provided. The external connection terminals 19 become input-output terminals of the semiconductor storage device 10 when inserting the semiconductor storage device 10 into an external apparatus. The organic substrate 11 is singulated to have a shape in which the organic substrate 11 substantially does not overlap with a placing portion 21 of the lead frame 13 to be described later when the internal configuration of the semiconductor storage device 10 is viewed in plan (see also FIG. 9). In other words, in plan view, the portion in which the organic substrate 11 does not overlap with the memory chip placing portion (placing portion) 21 is larger than the portion in which the organic substrate 11 overlaps with the placing portion 21.

An upper surface 11b (the other surface) of the organic substrate 11 becomes the mounting surface on which the controller chip 16 and the electronic components 17 are mounted. Therefore, the area of the upper surface 11b of the organic substrate 11 is larger than the area of the controller chip 16 and the electronic components 17 when viewed from the upper surface. On the upper surface 11b of the organic substrate 11, a plurality of connection pads (not shown) is formed. The connection pads and the external connection terminals 19 and the connection pads themselves are electrically connected via the internal wires (such as through holes) of the organic substrate 11. The electrode pads (not shown) of the semiconductor memory chip 15 and the controller chip 16 are electrically connected to the connection pads, so that the respective components such as the semiconductor memory chip 15, the controller chip 16, and the external connection terminals 19 are electrically connected.

The connection pads connected to the semiconductor memory chip 15 among a plurality of the connection pads are arranged substantially parallel to a direction in which the external terminals are aligned. Moreover, the connection pads connected to the controller chip 16 among a plurality of the connection pads are arranged near the electrode pads of the controller chip 16. Consequently, the electrode pads of the semiconductor memory chip 15 and the connection pads arranged on the upper surface 11b of the organic substrate 11 can be directly connected by metal wires 27. Furthermore, the electrode pads of the controller chip 16 and the connection pads arranged on the upper surface 11b of the organic substrate 11 can be directly connected by metal wires 28. Moreover, the distance between the connection pads connected to the semiconductor memory chip 15 and the controller chip 16 can be shortened by arranging the connection pads connected to the semiconductor memory chip 15 and the connection pads connected to the controller chip 16 between the electrode pads of the semiconductor memory chip 15 and the electrode pads of the controller chip 16. Consequently, the semiconductor memory chip 15 and the controller chip 16 can be connected with low resistance. The arrangement of the connection pads of the organic substrate 11 is not limited to the above described one. For example, when the controller chip 16 is rotated 180° from the arrangement shown in FIG. 3, the connection pads connected to the controller chip 16 are arranged to sandwich the controller chip 16 with the connection pads connected to the semiconductor memory chip 15.

Moreover, among a plurality of the connection pads, the pitch of the connection pads electrically connected to the semiconductor memory chip 15 is approximately about 80 to 150 μm, and the pitch of the connection pads electrically connected to the controller chip 16 is approximately about 50 to 120 μm. In other words, the pitch of the connection pads electrically connected to the controller chip 16 is smaller than the pitch of the connection pads electrically connected to the semiconductor memory chip 15.

Figure 6:
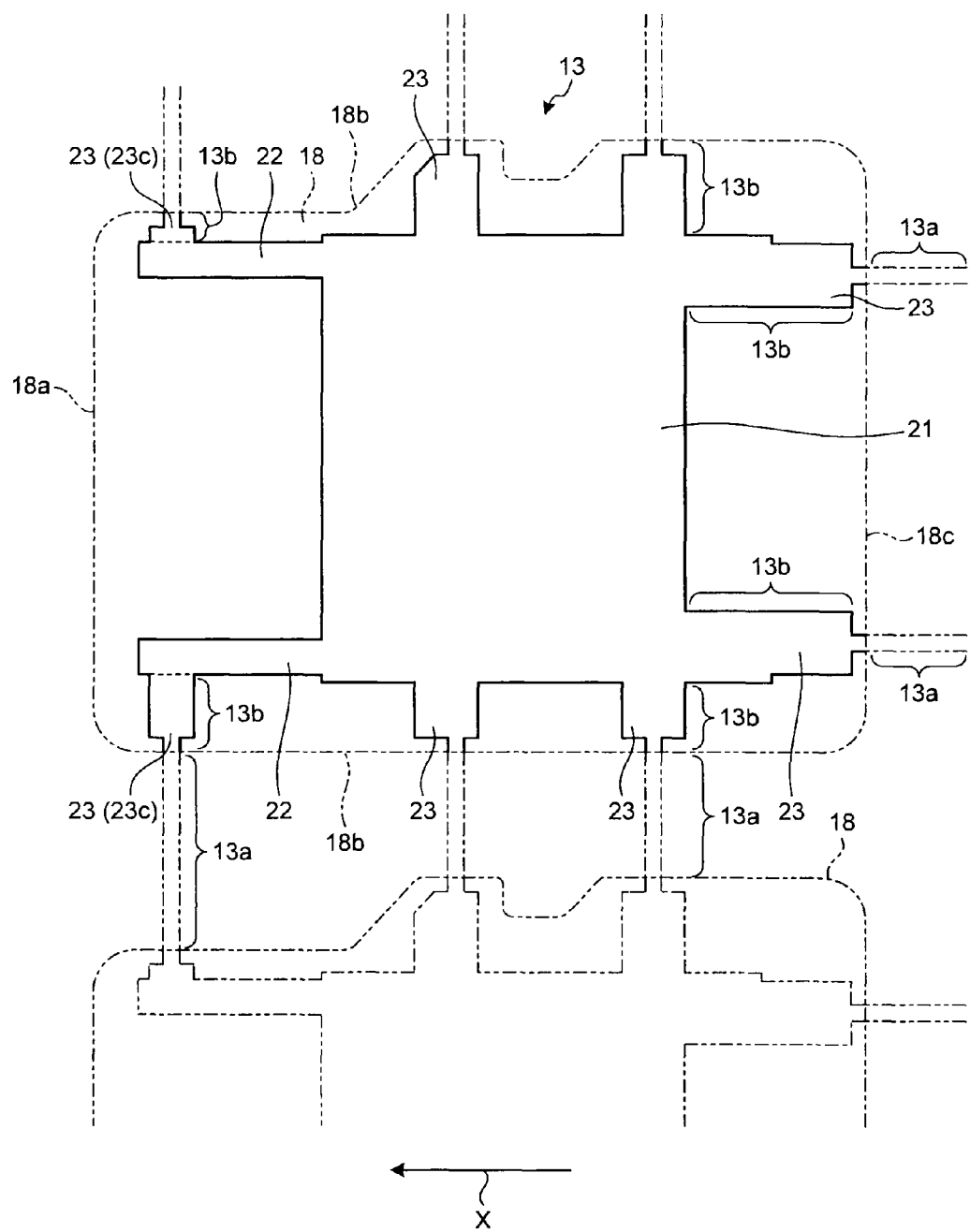
FIG. 6 is a plan view of a lead frame.

FIG. 6 is a plan view of the lead frame 13. In FIG. 6, the outline of the semiconductor storage device 10, i.e., the outline of the resin mold section 18 is indicated by chain double-dashed lines. For the lead frame 13, a general-purpose material relatively cheaper than the material used for the organic substrate 11, for example, 42Alloy or copper is used. The lead frame 13 includes the placing portion 21, substrate adhering portions 22, and connection portions 23.

The placing portion 21 is a region for placing the semiconductor memory chip 15. The substrate adhering portions 22 and the connection portions 23 are formed around the placing portion 21 to extend from the placing portion 21. The substrate adhering portions 22 are formed to extend toward a surface 18a on the insertion direction side indicated by the arrow X among the surfaces forming the outline of the resin mold section 18. Moreover, the placing portion 21 is formed to have a length that does not reach the surface 18a on the insertion direction side in a state of being adhered to the organic substrate 11. In other words, the end portions of the substrate adhering portions 22 on the insertion direction side are on the organic substrate 11 (within the resin mold section 18). In the following explanation, the surface intersecting with the surface 18a on the insertion direction side is called a surface 18b and the surface opposing the surface 18a is called a surface 18c in some cases.

The substrate adhering portion 22 is a region to be adhered to the upper surface 11b of the organic substrate 11 with an adhesive. The placing portion 21 is positioned at a position at which the placing portion 21 substantially does not overlap with the organic substrate 11 in plan view by adhering the substrate adhering portions 22 to the upper surface 11b of the organic substrate 11.

The connection portion in the substrate adhering portion 22 is called a connection portion 23c in some cases. This connection portion 23c is present on the surface 18c side of the end portion of the substrate adhering portion 22 on the insertion direction side. The position of the end portion of the connection portion 23c on the insertion direction side and the position of the end portion of the substrate adhering portion 22 on the insertion direction side can be the same. The connection portion 23c is formed to extend toward the surface 18b.

Although the placing portion 21 and the organic substrate 11 substantially do not overlap with each other in plan view, they overlap with each other in part of a region. In this overlapping portion, the placing portion 21 and the organic substrate 11 are bonded. The contact area of the organic substrate 11 and the lead frame 13 becomes large by bonding the placing portion 21 to the organic substrate 11. Therefore, the adhesion force between the organic substrate 11 and the lead frame 13 can be increased compared with the case of adhering the organic substrate 11 only to the substrate adhering portions 22. The placing portion 21 and the organic substrate 11 can be adhered to each other by using an adhesive to the overlapping portion. Consequently, the adhesion force between the organic substrate 11 and the lead frame 13 can be further increased.

The connection portions 23 are formed to extend from the placing portion 21 and the substrate adhering portions 22 toward the outside of the semiconductor storage device 10, i.e., the outside of the resin mold section 18 to be described later. As shown in FIG. 6, in the lead frame 13, a plurality of the connection portions 23 is formed. In the manufacturing stage of the semiconductor storage devices 10, the connection portions 23 connect a plurality of the lead frames 13 with each other. In this manner, many semiconductor storage devices 10 can be collectively manufactured by connecting a plurality of the lead frames 13 with each other. In the first embodiment, a plurality of the connection portions 23 is formed to extend toward three surfaces excluding the surface 18a on the insertion direction side among four surfaces of the semiconductor storage device 10 having an approximately rectangular shape in plan view.

In at least one side among four sides forming the outline of the resin mold section 18 in plan view, two or more connection portions 23 are provided to extend toward the one surface.

The connection portion 23 includes an excess portion 13*a* and an extending portion 13*b*. The excess portion 13*a* is a portion that protrudes from the outline of the semiconductor storage device 10 and is finally cut off to be removed. The extending portion 13*b* does not protrude from the final outline of the semiconductor storage device 10 and forms part of the semiconductor storage device 10. By removing the excess portion 13*a*, the extending portion 13*b* is formed to extend to the surface (the surface 18*b* or 18*c*) of the resin mold section 18 different from the surface 18*a* on the insertion direction side with respect to the placing portion 21 and the substrate adhering portion 22. The extending portion 13*b* that is formed on the substrate adhering portion 22 and extends to the surface 18*b* becomes a first extending portion and the extending portion 13*b* that extends from the placing portion 21 to the surface 18*c* becomes a second extending portion.

The connection portion 23 is formed such that the boundary portion with the outside of the semiconductor storage device 10 becomes thinner than the root portion on the side of the placing portion 21 or the substrate adhering portion 22 in plan view. Specially, in the first embodiment, the connection portion 23 is formed to become thin near the boundary portion with the outside of the semiconductor storage device 10.

The semiconductor memory chip 15 is a storage element such as a NAND-type flash memory. The semiconductor memory chip 15 includes a plurality of electrode pads on one side thereof. The pitch of the electrode pads of the semiconductor memory chip 15 is approximately about 80 μm or more, and the connection pads electrically connected to the semiconductor memory chip 15 among a plurality of the connection pads of the organic substrate 11 are formed to have a pitch of approximately about 80 to 150 μm in accordance with the semiconductor memory chip. On the placing portion 21, a plurality of the semiconductor memory chips 15 is stacked. The semiconductor memory chip 15 of the lowermost layer among a plurality of the semiconductor memory chips 15 is adhered to the placing portion 21 with an adhesive material 25. As the adhesive material 25, for example, a thermosetting or photo-curable die attach film (adhesive film) whose main component is a typical polyimide resin, epoxy resin, acrylic resin, or the like, or a liquid material is used.

On the semiconductor memory chip 15 of the lowermost layer adhered to the placing portion 21, another semiconductor memory chip 15 is adhered stepwise, whereby a plurality of the semiconductor memory chips 15 is stacked. The electrode pads provided on one side of the semiconductor memory chip 15 can be exposed by stacking the semiconductor memory chips 15 stepwise. Moreover, the semiconductor memory chips 15 are stacked such that the side of each of the semiconductor memory chips 15 on which the electrode pads are arranged faces the organic substrate 11. These exposed electrode pads are electrically connected (wire-bonded) to the connection pads of the organic substrate 11 by the metal wires 27 such as Au wires.

The controller chip 16 is mounted on the upper surface 11*b* of the organic substrate 11. The controller chip 16 selects the semiconductor memory chip 15, to or from which data is written or read out, among a plurality of the semiconductor memory chips 15. The controller chip 16 performs writing of data on the selected semiconductor memory chip 15, readout of data stored in the selected semiconductor memory chip 15, and the like. On the upper surface of the controller chip 16, the electrode pads (not shown) are formed. The number of the electrode pads of the controller chip 16 is larger than the number of the electrode pads of the semiconductor memory chip 15. Moreover, the pitch of the electrode pads of the controller chip 16 is approximately about 30 to 100 μm, which is narrower than the pitch of the connection pads, which are electrically connected to the controller chip 16, among a plurality of the connection pads of the organic substrate 11. The electrode pads of the controller chip 16 and the connection pads of the organic substrate 11 are wire-bonded by the metal wires 28.

The electronic components 17 are mounted on the upper surface 11*b* of the organic substrate 11. The electronic component 17 is, for example, a chip capacitor, a resistor, or an inductor. The electronic components 17 are arranged on the organic substrate 11 to be electrically connected to the semiconductor memory chip 15 and the controller chip 16 via the internal wires of the organic substrate 11 without being connected by metal wires. Consequently, the parasitic capacitance and the parasitic resistance of the semiconductor storage device 10 can be reduced.

The resin mold section 18 is formed by sealing the upper surface 11*b* of the organic substrate 11 and both surfaces of the lead frame 13 with a resin material. The external connection terminals 19 are exposed to the outside by sealing the upper surface 11*b* of the organic substrate 11 with a resin material. The resin mold section 18 forms the outer shell of the semiconductor storage device 10. The resin mold section 18 is formed to have a height that covers the semiconductor memory chip 15 and the controller chip 16. The resin mold section 18 is formed by covering the organic substrate 11 and the lead frame 13, on which mounting components such as the semiconductor memory chip 15 are mounted, with a mold and injecting a softened resin material in the mold.

Figure 7:
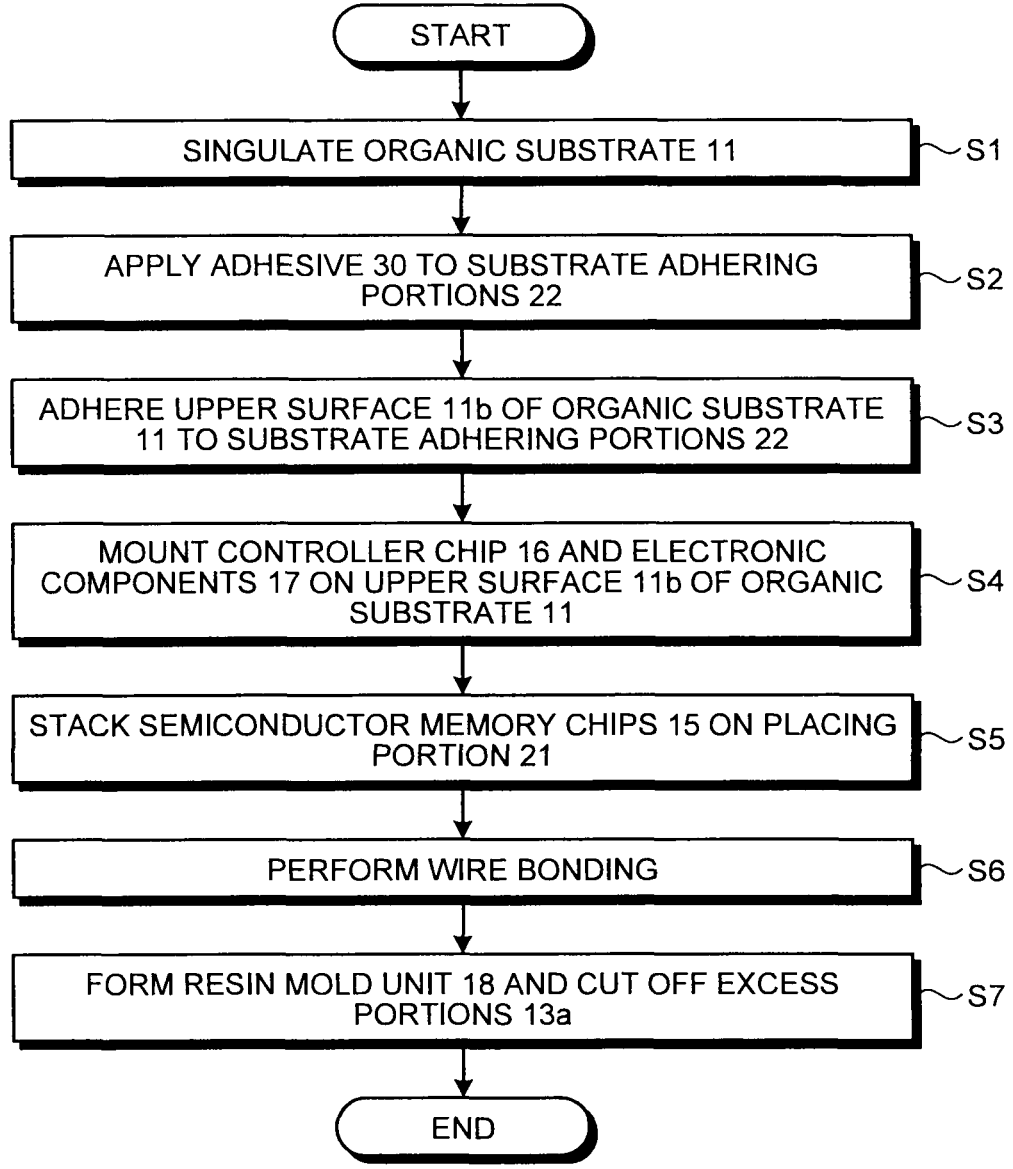
FIG. 7 is a flowchart for explaining a manufacturing process of the semiconductor storage device.
Figure 8:
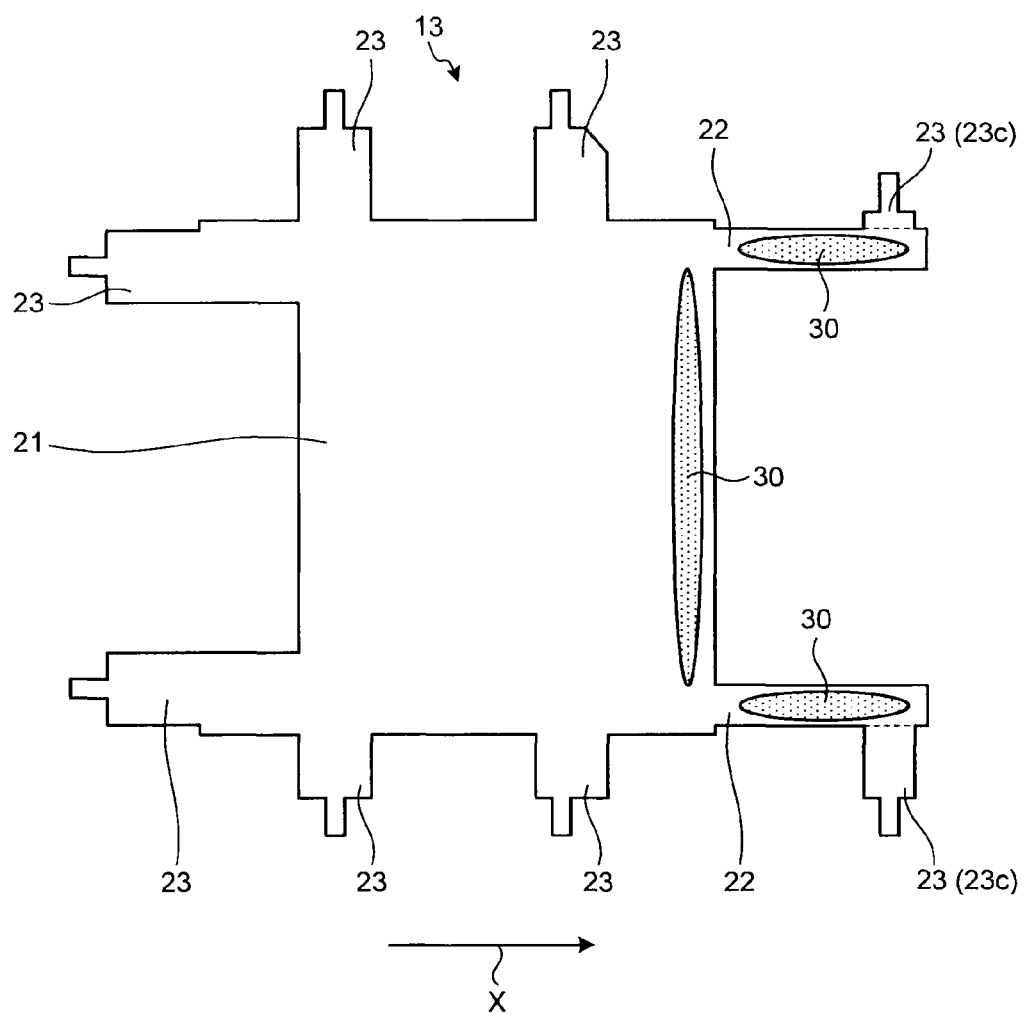
FIG. 8 is a diagram for explaining the manufacturing process of the semiconductor storage device.

Next, the manufacturing process of the semiconductor storage device 10 is explained. FIG. 7 is a flowchart for explaining the manufacturing process of the semiconductor storage device 10. FIG. 8 to FIG. 13 are diagrams for explaining the manufacturing process of the semiconductor storage device 10.

First, the organic substrate 11 is singulated (Step S1). The singulation of the organic substrate 11 can be performed by a typical process using a dicing blade (not shown), so that detailed explanation is omitted. Next, an adhesive 30 is applied to the substrate adhering portions 22 of the lead frame 13 (Step S2, see also FIG. 8). As the adhesive 30, for example, a thermosetting or photo-curable die attach film (adhesive film) whose main component is typical polyimide resin, epoxy resin, acrylic resin, or the like, or a liquid material is used. The adhesive 30 is also applied to a portion in which the placing portion 21 overlaps with the organic substrate 11. The adhesive 30 applied to the portion in which the placing portion 21 overlaps with the organic substrate 11 can be omitted.

Figure 9:
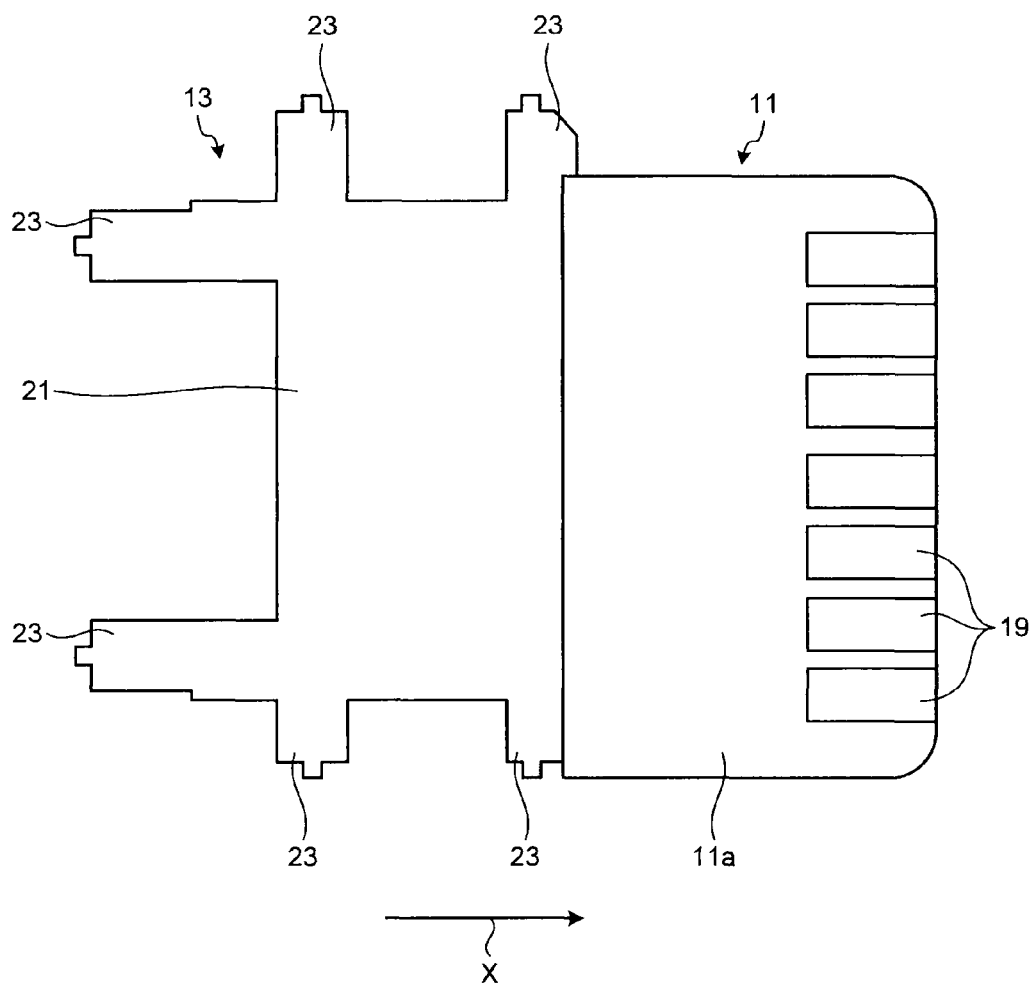
FIG. 9 is a diagram for explaining the manufacturing process of the semiconductor storage device.
Figure 10:
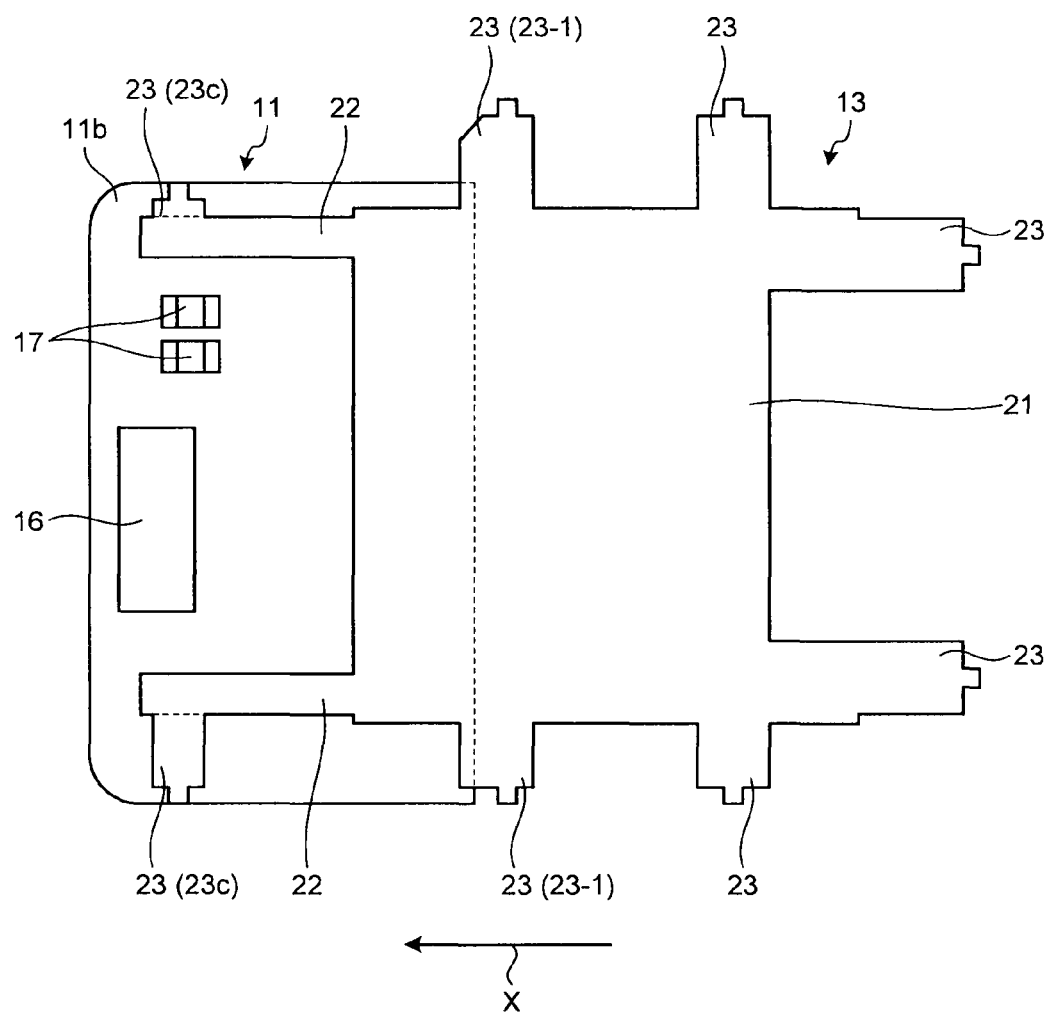
FIG. 10 is a diagram for explaining the manufacturing process of the semiconductor storage device.
Figure 11:
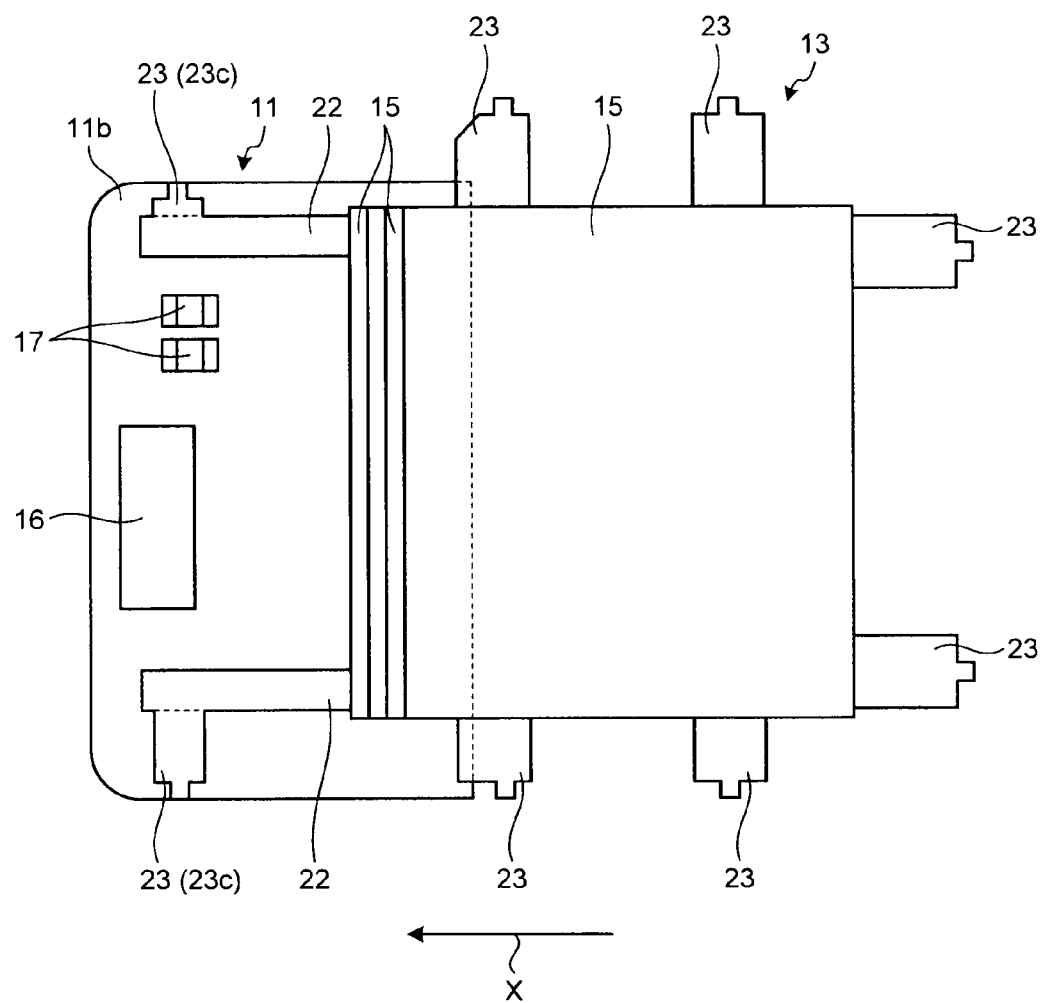
FIG. 11 is a diagram for explaining the manufacturing process of the semiconductor storage device.

Next, the upper surface 11*b* of the organic substrate 11 is adhered to the substrate adhering portions 22 to which the adhesive 30 is applied (Step S3, see also FIG. 9). Next, the controller chip 16 and the electronic components 17 are mounted on the upper surface 11*b* of the organic substrate 11 (Step S4, see also FIG. 10). Next, the semiconductor memory chip 15 is adhered to the placing portion 21 via the adhesive material 25 and moreover, the semiconductor memory chip 15 is adhered thereto to stack the semiconductor memory chips 15 (Step S5, see also FIG. 11).

Figure 12:
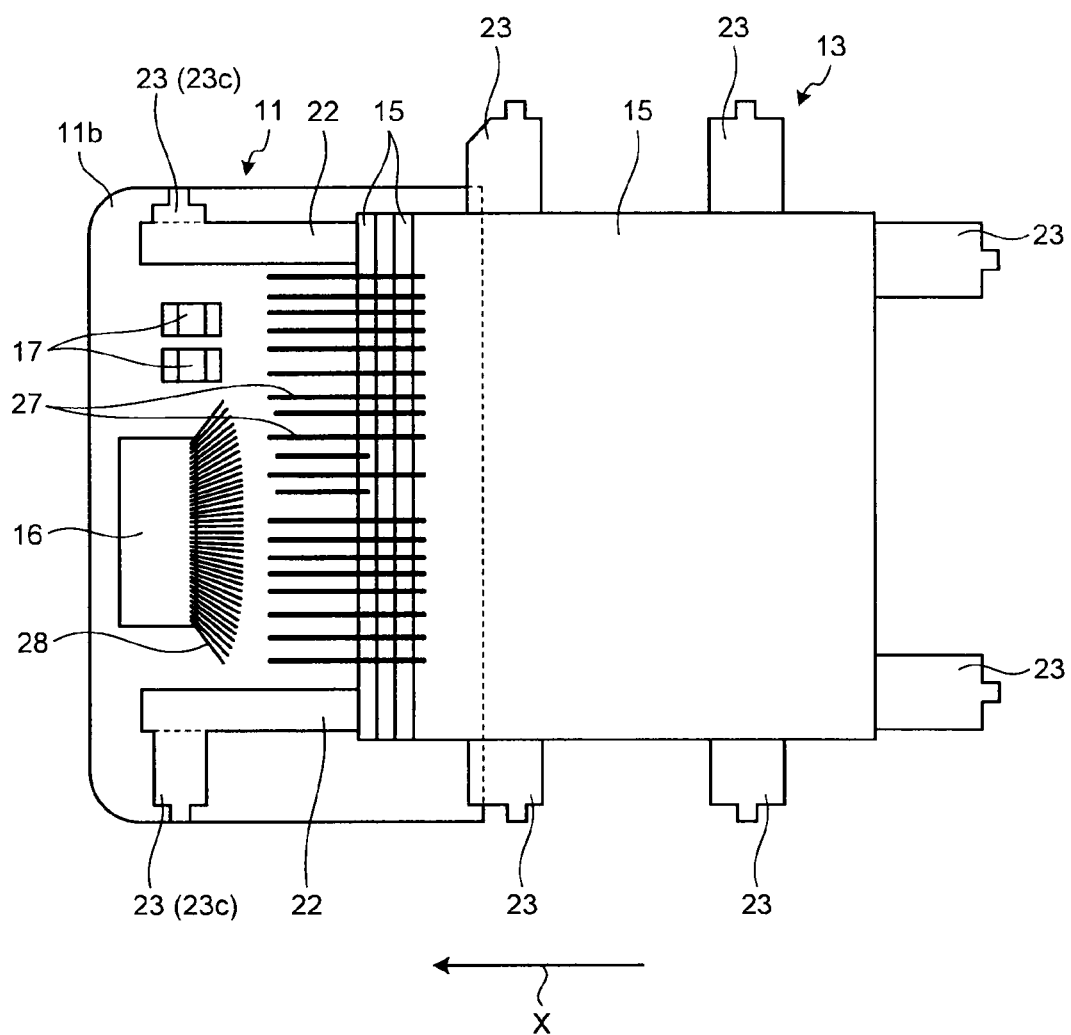
FIG. 12 is a diagram for explaining the manufacturing process of the semiconductor storage device.
Figure 13:
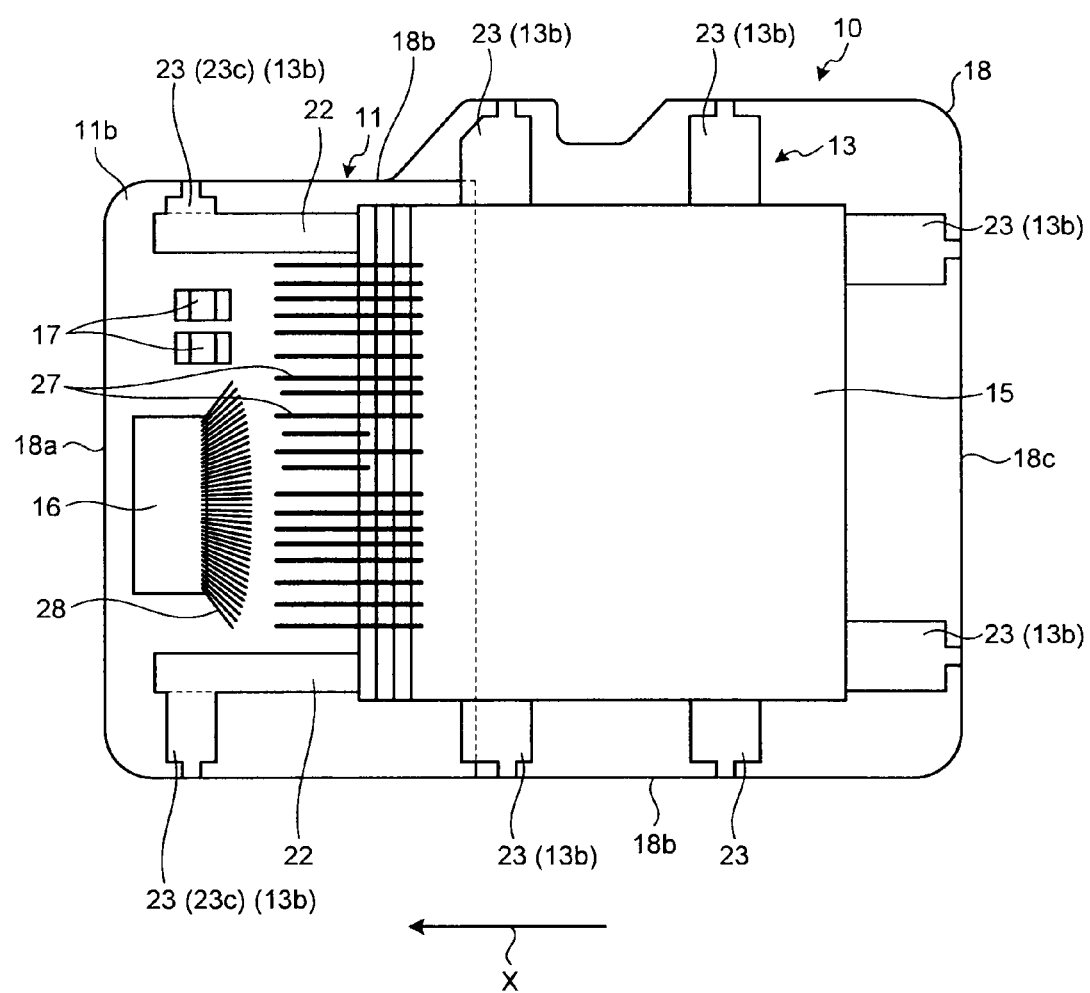
FIG. 13 is a diagram for explaining the manufacturing process of the semiconductor storage device.

Next, the electrode pads of the semiconductor memory chip 15 and the connection pads of the organic substrate 11, and the electrode pads of the controller chip 16 and the connection pads of the organic substrate 11 are wire-bonded by the metal wires 27 and 28 (Step S6, see also FIG. 12). Next, the upper surface 11b of the organic substrate 11 and both surfaces of the lead frame 13 are sealed with a resin material to form the resin mold section 18, and the excess portions 13a are cut off (Step S7, see also FIG. 13). In FIG. 13, the internal configuration (such as the semiconductor memory chip 15), which is covered by the resin mold section 18 and actually cannot be seen, is also illustrated for convenience' sake of explanation. The semiconductor storage device 10 is manufactured by a series of the above processes.

In the first embodiment as above, when the internal configuration of the semiconductor storage device 10 is viewed in plan, the organic substrate 11 is singulated to have a shape that substantially does not overlap with the placing portion 21, so that the size of the organic substrate 11 is reduced and therefore the usage of the organic substrate 11 can be significantly suppressed. Thus, the manufacturing cost of the semiconductor storage device 10 can be suppressed. It is applicable to singulate the organic substrate 11 to have a shape approximately the same as a region S (see FIG. 5), in which the external connection terminals 19 are provided, in plan view to further reduce the size of the organic substrate 11.

Moreover, the external connection terminals 19, which are the input-output terminals of the semiconductor storage device 10, are positioned on the insertion direction side of the semiconductor storage device 10 as shown in FIG. 2. Terminals that are provided in a socket of an external apparatus and are brought into contact with the external connection terminals 19 are also positioned on the insertion direction side with respect to the semiconductor storage device 10 inserted into the socket. In the first embodiment, the substrate adhering portions 22 are formed to have a length that does not reach the surface 18a of the resin mold section 18 on the insertion direction side and the extending portions 13b are not formed toward the surface 18a on the insertion direction side. In other words, the lead frame 13 is not exposed to the surface 18a on the insertion direction side. Therefore, it is possible to prevent part of the lead frame 13 and the terminals provided in the socket from coming into contact with each other and thus prevent a short-circuit from occurring.

Furthermore, the surface 18a of the resin mold section 18 on the insertion direction side becomes a front surface in a moving direction when inserting the semiconductor storage device 10 into a socket of an external apparatus, so that the surface 18a on the insertion direction side is easy to come into contact with the external apparatus itself or the like. As described above, because the lead frame 13 is not exposed to the surface 18a on the insertion direction side, when inserting the semiconductor storage device 10 into the socket of the external apparatus, it is possible to prevent part of the lead frame 13 from coming into contact with part of the external apparatus and thus prevent a short-circuit from occurring.

Moreover, in the process of forming the resin mold section 18, the connection portions 23 formed on the placing portion 21 and the like are held by a mold to hold the lead frame 13. The connection portions 23 are held by the mold, so that the placing portion 21 is easily held at an appropriate position in the mold. When a resin material is injected into the mold, if the lead frame 13 moves due to the injection pressure thereof, for example, the semiconductor memory chip 15 is exposed from the resin mold section 18. However, such a problem can be prevented from occurring, so that the yield can be improved. Specially, the connection portions 23 that extend to the surface 18c are included in addition to the connection portions 23c, so that the lead frame 13 can be fixed stably. Moreover, connection portions 23-1 (see FIG. 10) adjacent to the surface 18c side with respect to the connection portions 23c are included in addition to the connection portions 23c, so that the lead frame 13 can be fixed stably. The extending portion 13b included in the connection portion 23-1 becomes the third extending portion.

Furthermore, in at least one side among four sides of the semiconductor storage device 10 in plan view, two or more connection portions 23 are provided to extend toward the one side, so that the holding force that holds the lead frame 13 by the mold described above can be further increased.

Moreover, the connection portions 23 (23c) are formed to extend also from the substrate adhering portions 22. Therefore, the holding force that holds the substrate adhering portions 22 by the mold is increased in the process of forming the resin mold section 18 by the same reason as the above. In the semiconductor storage device 10, the bottom surface 11a of the organic substrate 11 is exposed. Therefore, in the process of forming the resin mold section 18, it is needed to prevent ingress of resin into a gap between the bottom surface 11a and the mold by closely attaching the bottom surface 11a of the organic substrate 11 and the mold.

For example, if the lead frame 13, particularly, the substrate adhering portion 22 is deformed in a direction in which the organic substrate 11 is away from the mold, a gap is generated between the bottom surface 11a of the organic substrate 11 and the mold and therefore resin easily enters. If the external connection terminals 19 are covered with the resin entered into the gap between the bottom surface 11a and the mold, problems occur such as occurrence of a contact failure with an external apparatus and generation of additional process of removing burr. On the other hand, in the first embodiment, the holding force that holds the substrate adhering portions 22 by the mold can be increased by the connection portions 23c (the extending portions 13b) that extend from the substrate adhering portions 22, so that deformation of the lead frame 13, specially, deformation of the substrate adhering portions 22 can be suppressed and thus the organic substrate 11 can be closely attached to the mold reliably. Consequently, resin is suppressed from entering into the gap between the bottom surface 11a of the organic substrate 11 and the mold, so that the yield can be improved and the manufacturing cost can be suppressed. As described above, the connection portions 23c (the extending portions 13b) formed on the substrate adhering portions 22 are not exposed to the surface 18a on the insertion direction side, so that a short-circuit can be prevented from occurring.

Moreover, the connection portions 23c are formed to extend to the outside of the both end surfaces 18b with respect to the substrate adhering portions 22. Consequently, the holding force that holds the substrate adhering portions 22 by the mold can be further increased.

Furthermore, because the connection portion 23 is formed such that the boundary portion with the outside of the semiconductor storage device 10 becomes thinner than the root portion on the side of the placing portion 21 and the substrate adhering portion 22 in plan view, the cutting area of the connection portion 23 when cutting off the excess portion 13a can be made small. Therefore, wear of a tool for cutting off the connection portions 23 is suppressed, enabling to prolong the life of the tool. Moreover, because the root portion of the connection portion 23 is thicker than the boundary portion with the outside of the semiconductor storage device 10, the strength of the connection portion 23 is suppressed from decreasing. Thus, the holding force that holds the lead frame 13 by the mold described above can be suppressed from decreasing.

Moreover, the relative positional relationship between the organic substrate 11 and the placing portion 21 is determined by bringing the lead frame 13 into contact with the organic substrate 11. Displacement between the semiconductor memory chip 15 and the organic substrate 11 is reduced by bringing the lead frame 13 into contact with the organic substrate 11, whereby a process failure in the wire bonding process can be suppressed to suppress deterioration of the yield. The organic substrate 11 and the lead frame 13 are finally sealed with the resin mold section 18, so that high reliability is not required for the adhesion of the organic substrate 11 and the lead frame 13 and it is sufficient that the adhesion between them is ensured until the forming process of the resin mold section 18. Put another way, it is possible to apply the adhesive 30 only to the placing portion 21 and the substrate adhering portions 22 and omit the adhesive 30 applied to the portion in which the placing portion 21 overlaps with the organic substrate 11. For example, when the portion in which the placing portion 21 overlaps with the organic substrate 11 is small, the adhesive 30 is prevented from being squeezed out from the portion in which the placing portion 21 overlaps with the organic substrate 11.

Furthermore, the connection portions 23-1 (see FIG. 10), which are positioned approximately in the middle portion of the lead frame 13 and extend from the portion in which the placing portion 21 overlaps with the organic substrate 11 toward the outside of the resin mold section 18, also overlap with the organic substrate 11. Consequently, the area in which the lead frame 13 is in contact with the organic substrate 11 can be increased. Thus, displacement between the semiconductor memory chip 15 and the organic substrate 11 is reduced, whereby a process failure in the wire bonding process can be suppressed to suppress deterioration of the yield.

The number of the electrode pads formed in the controller chip 16 tends to be larger than that of the semiconductor memory chip 15. Moreover, the controller chip 16 tends to be formed small in plan view from the upper surface compared with the semiconductor memory chip 15. Therefore, the electrode pads and the connection pads for wire-bonding the controller chip 16 are formed more densely than the electrode pads and the connection pads for wire-bonding the semiconductor memory chip 15. In the first embodiment, the controller chip 16 is mounted not on the lead frame 13 but on the organic substrate 11, so that wire bonding can be reliably performed even under the condition that the electrode pads and the connection pads are formed densely. On the other hand, the pitch of the electrode pads and the pitch of the connection pads for performing wire bonding of the semiconductor memory chip 15 are relatively wide. Therefore, wire bonding of the semiconductor memory chip 15 is relatively easy, so that wire bonding can be performed by mounting the semiconductor memory chip 15 on the lead frame 13 even if the distance therebetween is somewhat large.

Moreover, because the controller chip 16 and the electronic component 17 are mounted on the upper surface 11b of the organic substrate 11, the bottom surface 11a side of the organic substrate 11, i.e., the side on which the external connection terminals 19 are formed can be made approximately flat. Consequently, the semiconductor storage device 10 can be made small. Moreover, smooth insertion and removal of the semiconductor storage device 10 into and from electronics can be realized by reducing irregularities on the outer periphery of the semiconductor storage device 10.

Furthermore, the size of the organic substrate 11 is reduced in plan view, so that it is possible to suppress deformation of the organic substrate 11 by heat applied to the organic substrate 11 in the mounting process of the electronic components 17 and the like. As described above, the organic substrate 11 has a multilayered structure and the material to be used is different in each layer in some cases. Because the material is different in each layer, the linear expansion coefficient is also different for each layer. Therefore, deformation due to a thermal history is easy to occur. The ratio of the organic substrate 11 to the whole semiconductor storage device 10 becomes small by reducing the size of the organic substrate 11 in plan view, so that it is possible to make deformation of the whole semiconductor storage device 10 difficult to occur.

The determination of the positional relationship between the placing portion 21 and the organic substrate 11 is not limited to be performed by adhesion of the lead frame 13. For example, the organic substrate 11 and the lead frame 13 can be fixed separately by a mold for forming the resin mold section 18. The mutual relative positional relationship is determined by fixing the organic substrate 11 and the lead frame 13 to the mold.

In the first embodiment, explanation is given for the case of stacking a plurality of the semiconductor memory chips 15 on the placing portion 21 as an example, however, it is not limited thereto, and the semiconductor storage device 10 can be configured by adhering only one semiconductor memory chip 15 on the placing portion 21.

Moreover, the manufacturing process of the semiconductor storage device 10 is not limited to the case shown by the flowchart in FIG. 7. For example, before adhering the organic substrate 11 to the lead frame 13, the controller chip 16 and an electronic component can be mounted on the organic substrate 11. Furthermore, before singulating the organic substrate 11, the controller chip 16 and an electronic component can be mounted on the organic substrate 11.

Furthermore, the semiconductor storage device 10 according to the first embodiment can be applied to a micro SD card (registered trademark). Moreover, the semiconductor storage device 10 can be applied to various storage devices configured to include a semiconductor memory chip without being limited to a micro SD card.

Moreover, in the first embodiment, three connection portions 23 are arranged on the surface 18b and two connection portions 23 are arranged on the surface 18c, however, the number of the connection portions 23 is not limited thereto. According to the present embodiment, it is sufficient that at least the connection portion 23c, which is formed on the substrate adhering portion 22 and extends to the surface 18b, is included.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the sprit of the inventions. The accompanying claims and their equivalents are intended to cover such forms or modifications as would fall within the scope and spirit of the inventions.

What is claimed is:
1. A semiconductor storage device, insertable into an external apparatus, comprising:
   an organic substrate in which an external connection terminal is provided on one surface thereof;
   a semiconductor memory chip;
   a lead frame that includes a placing portion on which the semiconductor memory chip is placed and an adhering portion that is formed to extend toward a side of an insertion direction, the insertion direction being from the placing portion toward the external apparatus, wherein the lead frame is adhered to another surface of the organic substrate; and a resin mold section that exposes the external connection terminal and the organic substrate and seals the lead frame and the semiconductor memory chip, wherein the organic substrate is singulated to have a shape in which a portion in which the organic substrate does not overlap with the placing portion is larger than a portion in which the organic substrate overlaps with the placing portion, in plan view in a state of being adhered to the adhering portion, an end portion of the adhering portion in the insertion direction is formed within the resin mold section, the resin mold section has a first surface, a second surface, and a third surface, the first surface facing a same direction as the insertion direction, the second surface intersecting the first surface, the third surface facing away from the first surface, the lead frame further includes a first extending portion, the first extending portion extending perpendicularly from the adhering portion toward the second surface, and the lead frame further includes a second extending portion, the second extending portion extending perpendicularly from the placing portion toward the third surface.

2. The semiconductor storage device according to claim 1, wherein part of the organic substrate overlaps with part of the placing portion in plan view.

3. The semiconductor storage device according to claim 1, wherein the first extending portion includes a plurality of first extending portions, the first extending portions extending in the direction different from the insertion direction, and the lead frame further includes a third extending portion, the third extending portion being provided, with respect to the first extending portion, on a side opposite to the insertion direction, the third extending portion extending toward the second surface, the third extending portion being in contact with the organic substrate.

4. The semiconductor storage device according to claim 1, further comprising a controller chip mounted on another surface of the organic substrate.

5. The semiconductor storage device according to claim 4, wherein an internal wire is formed on the organic substrate, and the internal wire and the semiconductor memory chip, and the internal wire and the controller chip are connected by a bonding wire to electrically connect the controller chip and the semiconductor memory chip via the internal wire.

6. The semiconductor storage device according to claim 4, further comprising an internal wire formed on the organic substrate, wherein the controller chip and the external connection terminal are electrically connected via the internal wire.

7. The semiconductor storage device according to claim 1, further comprising an electronic component mounted on another surface of the organic substrate.

8. The semiconductor storage device according to claim 1, wherein the semiconductor memory chip is a NAND-type flash memory.

* * * * *